(12) United States Patent
Nishimori et al.

(10) Patent No.: US 9,099,351 B2
(45) Date of Patent: Aug. 4, 2015

(54) COMPOUND SEMICONDUCTOR DEVICE AND METHOD OF MANUFACTURING THE SAME

(71) Applicant: Transphorm Japan, Inc., Yokohama, Kanagawa (JP)

(72) Inventors: Masato Nishimori, Atsugi (JP); Tadahiro Imada, Kawasaki (JP); Toshihiro Ohki, Hadano (JP)

(73) Assignee: Transphorm Japan, Inc., Yokohama (JP)

( * ) Notice: Subject to any disclaimer, the term of this patent is extended or adjusted under 35 U.S.C. 154(b) by 40 days.

(21) Appl. No.: 13/942,773

(22) Filed: Jul. 16, 2013

(65) Prior Publication Data
US 2014/0084339 A1    Mar. 27, 2014

(30) Foreign Application Priority Data
Sep. 21, 2012   (JP) .................................. 2012-208845

(51) Int. Cl.
*H01L 29/78*    (2006.01)
*H01L 29/12*    (2006.01)
(Continued)

(52) U.S. Cl.
CPC ............ *H01L 29/12* (2013.01); *H01L 21/0254* (2013.01); *H01L 21/0262* (2013.01); *H01L 21/02378* (2013.01); *H01L 21/02458* (2013.01); *H01L 21/02521* (2013.01); *H01L 21/02576* (2013.01); *H01L 21/02579* (2013.01); *H01L 29/66462* (2013.01); *H01L 29/7787* (2013.01); *H01L 29/2003* (2013.01)

(58) Field of Classification Search
CPC ..................... H01L 21/0237; H01L 21/02378; H01L 29/78; H01L 29/1083; H01L 29/66431; H01L 29/66477; H01L 29/6646; H01L 29/7787; H01L 29/4236
USPC .................... 257/76, 192–195, E21.403, 121, 257/27.061, 29.246
See application file for complete search history.

(56) References Cited

U.S. PATENT DOCUMENTS 5,610,410 A * 3/1997 Imanishi ......................... 257/76
7,859,021 B2   12/2010 Kaneko
(Continued)

FOREIGN PATENT DOCUMENTS

| | | |
|---|---|---|
| JP | 2007-019309 | 1/2007 |
| JP | 2008-098434 | 4/2008 |

(Continued)

OTHER PUBLICATIONS

KIPO Notice of Preliminary Rejection in corresponding KR Application No. 10-2013-0088547, mailed Jun. 13, 2014, 8 pages.

(Continued)

*Primary Examiner* — Michael Lebentritt
(74) *Attorney, Agent, or Firm* — Fish & Richardson P.C.

(57) ABSTRACT

A compound semiconductor device includes as compound semiconductor layers: a first layer; a second layer larger in band gap than the first layer, formed above the first layer; a third layer having a p-type conductivity type, formed above the second layer; a gate electrode formed above the second layer via the third layer; a fourth layer larger in band gap than the second layer, formed to be in contact with the third layer above the second layer; and a fifth layer smaller in band gap than the fourth layer, formed to be in contact with the third layer above the fourth layer.

7 Claims, 15 Drawing Sheets

(51) Int. Cl.
*H01L 21/02* (2006.01)
*H01L 29/66* (2006.01)
*H01L 29/778* (2006.01)
*H01L 29/20* (2006.01)

(56) References Cited

U.S. PATENT DOCUMENTS

| | | | |
|---|---|---|---|
| 7,985,987 | B2 | 7/2011 | Kaneko |
| 8,076,698 | B2 | 12/2011 | Ueda et al. |
| 2006/0102926 | A1* | 5/2006 | Kikkawa et al. .............. 257/103 |
| 2009/0008677 | A1 | 1/2009 | Kikkawa |
| 2009/0058532 | A1* | 3/2009 | Kikkawa et al. .............. 330/295 |
| 2009/0146185 | A1* | 6/2009 | Suh et al. ..................... 257/194 |
| 2010/0264461 | A1* | 10/2010 | Rajan et al. ................... 257/194 |
| 2010/0314663 | A1* | 12/2010 | Ito et al. ....................... 257/192 |
| 2011/0266554 | A1 | 11/2011 | Hikita et al. |
| 2012/0139630 | A1* | 6/2012 | Ozaki et al. .................. 330/250 |
| 2013/0082360 | A1* | 4/2013 | Miyajima et al. ............. 257/628 |
| 2013/0214283 | A1* | 8/2013 | Briere et al. ................... 257/76 |
| 2014/0159119 | A1* | 6/2014 | Derluyn et al. ............... 257/194 |
| 2014/0253241 | A1* | 9/2014 | Lee et al. ...................... 330/277 |
| 2014/0266324 | A1* | 9/2014 | Teo et al. ...................... 327/109 |
| 2015/0028391 | A1* | 1/2015 | Takahashi .................... 257/195 |

FOREIGN PATENT DOCUMENTS

| | | |
|---|---|---|
| JP | 2009-071061 | 4/2009 |
| JP | 2009-076845 | 4/2009 |
| JP | 2010-225765 | 10/2010 |
| JP | 2011-181922 | 9/2011 |

OTHER PUBLICATIONS

Office Action in TW Application No. 102125224, mailed May 27, 2015, 11 pages.

* cited by examiner

COMPOUND SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2012-208845, filed on Sep. 21, 2012, the entire contents of which are incorporated herein by reference.

FIELD

The embodiments discussed herein are directed to a compound semiconductor device and a method of manufacturing the same.

BACKGROUND

There is considered application of a nitride semiconductor to a semiconductor device with high withstand voltage and high output power, utilizing characteristics such as high saturation electron speed and wide band gap. For example, the band gap of GaN as the nitride semiconductor is 3.4 eV, which is larger than the band gap of Si (1.1 eV) and the band gap of GaAs (1.4 eV), and thus GaN has high breakdown electric field intensity. Accordingly, GaN is quite promising as a material of a semiconductor device for power supply which obtains high voltage operation and high output power.

As a semiconductor device using the nitride semiconductor, there have been made numerous reports on a field effect transistor, particularly a high electron mobility transistor (HEMT). For example, among GaN-based HEMTs (GaN-HEMTs), AlGaN/GaN.HEMT using GaN as an electron transit layer and AlGaN as an electron supply layer is attracting attention. In the AlGaN/GaN.HEMT, a strain resulted from a lattice constant difference between GaN and AlGaN occurs in AlGaN. Two-dimensional electron gas (2DEG) of high concentration is obtained from piezoelectric polarization and spontaneous polarization of AlGaN caused by the strain. Accordingly, the AlGaN/GaN. HEMT is expected as a high efficiency switch element and a high-withstand-voltage electric power device for electric vehicle, or the like.

Patent Document 1: Japanese Laid-open Patent Publication No. 2009-76845
Patent Document 2: Japanese Laid-open Patent Publication No. 2007-19309
Patent Document 3: Japanese Laid-open Patent Publication No. 2010-225765
Patent Document 4: Japanese Laid-open Patent Publication No. 2009-71061

Generally, a power switching element is required to perform a so-called normally-off operation in which no current flows through the power switching element when the gate voltage is 0 V. However, the GaN-HEMT has a problem of being difficult to realize a normally-off type transistor because of generation 2DEG of high concentration. To address the problem, studies have been conducted to decrease the concentration of 2DEG by etching an electron supply layer directly under a gate electrode so as to achieve Normally Off (see Patent Document 1). In this method, however, the etching damages the vicinity of an electron transit layer located under the electron supply layer, bringing about problems such as increase in sheet resistance, increase in leak current and so on. Hence, a technique has been proposed which additionally forms a p-type GaN layer having a p-type conductivity type between the gate electrode and an active region in the AlGaN/GaN.HEMT to thereby cancel the 2DEG directly under the gate electrode to achieve Normally Off (see Patent Document 2).

A schematic structure of the AlGaN/GaN.HEMT according to the prior art is exemplified in FIG. 1.

In this AlGaN/GaN.HEMT, a nucleus formation layer is formed on a substrate, an electron transit layer 101 composed of i (intentionally undoped)-GaN is formed thereon, and an electron supply layer 102 composed of i-AlGaN is formed thereon. 2DEG is generated in the vicinity of an interface of the electron transit layer 101 with the electron supply layer 102. A p-type GaN layer 103 is formed on the electron supply layer 102, and a gate electrode 104 is formed thereon. A source electrode 105 and a drain electrode 106 are formed on both sides of the gate electrode 104 on the electron supply layer 102.

At the time when no voltage is applied to the gate electrode 104, halls are unevenly distributed at a lower part of the p-type GaN layer 103 (in the vicinity of an interface of the p-type GaN layer 103 with the electrode supply layer 102). Electrons are drawn by the halls and induced in the vicinity of the interface of the electron transit layer 101 with the electron supply layer 102 below the halls. This turns on a gate voltage Vg. Thus, there is a problem in which Normally Off is inhibited to fail to increase a threshold voltage.

SUMMARY

An aspect of a compound semiconductor device includes: a first compound semiconductor layer; a second compound semiconductor layer larger in band gap than the first compound semiconductor layer, formed above the first compound semiconductor layer; a third compound semiconductor layer having a p-type conductivity type, formed above the second compound semiconductor layer; an electrode formed above the second compound semiconductor layer via the third compound semiconductor layer; a fourth compound semiconductor layer larger in band gap than the second compound semiconductor layer, formed to be in contact with the third compound semiconductor layer above the second compound semiconductor layer; and a fifth compound semiconductor layer smaller in band gap than the fourth compound semiconductor layer, formed to be in contact with the third compound semiconductor layer above the fourth compound semiconductor layer.

An aspect of a method of manufacturing a compound semiconductor device, includes: forming a second compound semiconductor layer larger in band gap than a first compound semiconductor layer above the first compound semiconductor layer; forming a third compound semiconductor layer having a p-type conductivity type above the second compound semiconductor layer; forming an electrode above the second compound semiconductor layer via the third compound semiconductor layer; forming a fourth compound semiconductor layer larger in band gap than the second compound semiconductor layer to be in contact with the third compound semiconductor layer, above the second compound semiconductor layer; and forming a fifth compound semiconductor layer smaller in band gap than the fourth compound semiconductor layer to be in contact with the third compound semiconductor layer above the fourth compound semiconductor layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

In this embodiment, an AlGaN/GaN HEMT of a nitride semiconductor is disclosed as a compound semiconductor device.

FIG. 2A to FIG. 2C and FIG. 3A and FIG. 3B are schematic cross-sectional views illustrating a method of manufacturing the AlGaN/GaN HEMT according to the first embodiment in order of processes.

Figure 2A:
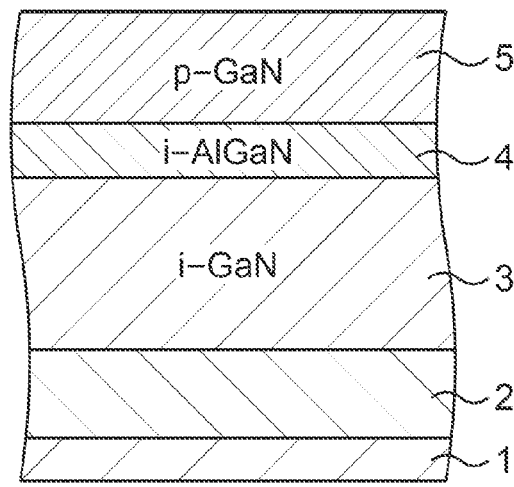
FIG. 2A to FIG. 2C are schematic cross-sectional views illustrating a method of manufacturing an AlGaN/GaN HEMT according to a first embodiment in order of processes.

First, as illustrated in FIG. 2A, a buffer layer 2, an electron transit layer 3, an electron supply layer 4, and a p-type GaN layer 5 are formed in order on, for example, a SiC substrate 1 being a growth substrate. As the growth substrate, a Si substrate, a sapphire substrate, a GaAs substrate, a GaN substrate, or the like may be used instead of the SiC substrate. The conductivity of the substrate may be either semi-insulating or conductive.

More specifically, on the SiC substrate 1, the following compound semiconductors are grown in a reduced-pressure atmosphere by, for example, an MOVPE (Metal Organic Vapor Phase Epitaxy) method. An MBE (Molecular Beam Epitaxy) method or the like may be used instead of the MOVPE method.

On the SiC substrate 1, AlN is grown with a thickness of about 100 nm, i-GaN is grown with a thickness of about 3 µm, i-AlGaN is grown with a thickness of about 20 nm, and p-GaN is grown with a thickness of about 80 nm in order. Thus, the buffer layer 2, the electron transit layer 3, the electron supply layer 4 and the p-type GaN layer 5 are formed.

The buffer layer 2 will be a nucleus formation layer and may be formed by using AlGaN instead of AlN or growing GaN at a low temperature.

The electron supply layer 4 is composed of $Al_{0.2}Ga_{0.8}N$ having an Al composition ratio of 0.2. Instead of i-AlGaN, n-type AlGaN (n-AlGaN) may be formed.

A p-type AlGaN layer may be formed instead of the p-type GaN layer 5.

Between the electron transit layer 3 and the electron supply layer 4, a spacer layer (intermediate layer) may be formed.

As a growth condition of AlN, mixed gas of trimethylaluminum (TMAl) gas and ammonia ($NH_3$) gas is used as a source gas. As a growth condition of GaN, mixed gas of trimethylgallium (TMG) gas and $NH_3$ gas is used as a source gas. As a growth condition of AlGaN, mixed gas of TMA gas, TMG gas, and $NH_3$ gas is used as a source gas. According to the compound semiconductor layer to be grown, whether or not to supply the trimethylaluminum gas being an Al source and the trimethylgallium gas being a Ga source and flow rates thereof are appropriately set. The flow rate of the ammonia gas being a common source is set to about 100 ccm to about 10 LM. Further, growth pressure is set to about 50 Torr to about 300 Torr, and growth temperature is set to about 1000° C. to about 1200° C.

In order to form the electron supply layer 4 of n-AlGaN, $SiH_4$ gas containing Si as n-type impurity is added to the source gas at a predetermined flow rate, thereby doping AlGaN with Si. A doping concentration of Si is set to about $1 \times 10^{18}/cm^3$ to about $1 \times 10^{20}/cm^3$, for example, set to about $5 \times 10^{18}/cm^3$.

In order to form the p-type GaN layer 5, cyclopentadienyl magnesium (CpMg) gas containing, for example, Mg as p-type impurity is fed, thereby doping GaN with Mg. A doping concentration of Mg is set to about $1 \times 10^{18}/cm^3$ to about $1 \times 10^{20}/cm^3$, for example, set to about $5 \times 10^{18}/cm^3$. Thereafter, annealing is applied to p-GaN, for example, at 800° C. for about 20 minutes to activate the doped Mg.

Figure 2B:
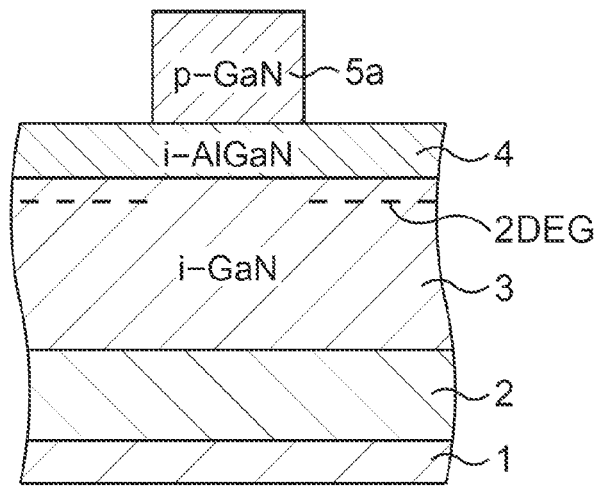

Subsequently, as illustrated in FIG. 2B, the p-type GaN layer 5 is etched.

More specifically, a resist is applied on the p-type GaN layer 5, and a site other than a gate electrode formation scheduled region is irradiated with ultraviolet ray using a predetermined mask. Thus, a resist mask covering the gate electrode formation scheduled region of the p-type GaN layer 5 with the resist is formed. By using this resist mask and using Cl$_2$-based etching gas, the p-type GaN layer 5 is dry etched. Thus, the p-type GaN layer 5 remains only in the gate electrode formation scheduled region. The remaining p-type GaN layer 5 is a p-type GaN layer 5a.

The resist mask is removed by ashing or chemical treatment.

Figure 2C:
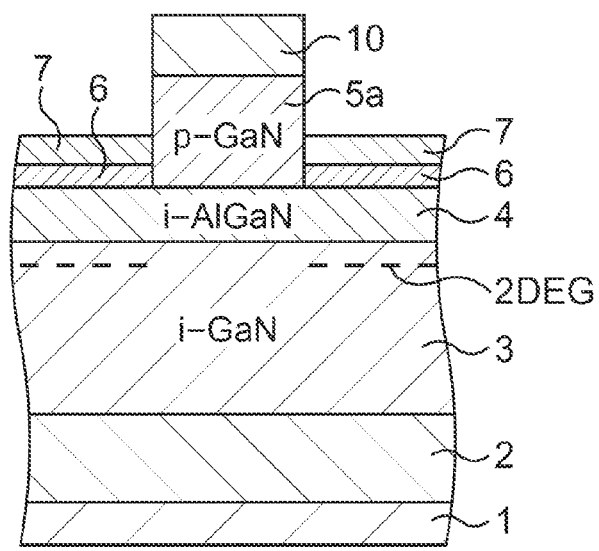

Subsequently, as illustrated in FIG. 2C, an AlN layer 6 and an AlGaN layer 7 are formed in order on the electron supply layer 4 on both side surfaces of the p-type GaN layer 5a.

More specifically, a predetermined resist mask is first formed and, for example, SiO$_2$ is deposited by a CVD method or the like to form a mask layer 10 covering an upper surface of the p-type GaN layer 5a.

Then, AlN is deposited with a thickness of about 2 nm and i-AlGaN is deposited with a thickness of about 10 nm in order on the electron supply layer 4 in a reduced-pressure atmosphere by, for example, the MOVPE method. Thus, the AlN layer 6 and the AlGaN layer 7 are formed. The AlGaN layer 7 is composed of, for example, i-Al$_{0.1}$Ga$_{0.9}$N having an Al composition ratio of 0.1.

The mask layer 10 is removed by chemical treatment or the like.

Subsequently, element isolation structures are formed.

More specifically, argon (Ar), for instance, is injected to element isolation regions above the SiC substrate 1. Thus, the element isolation structures are formed in the AlGaN layer 7, the AlN layer 6, the electron supply layer 4 and in a surface layer portion of the electron transit layer 3. The element isolation structures demarcate active regions on the AlGaN layer 7.

Incidentally, instead of the above injection method, an STI (Shallow Trench Isolation) method, for instance, may be performed for the element isolation.

Figure 3A:
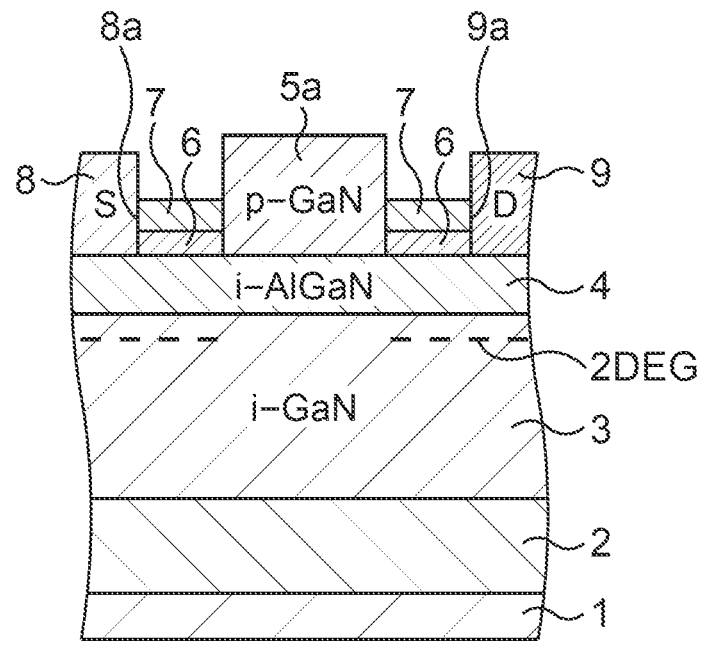
FIG. 3A and FIG. 3B are schematic cross-sectional views, subsequent to FIG. 2A to FIG. 2C, illustrating the method of manufacturing the AlGaN/GaN HEMT according to the first embodiment in order of processes.

Subsequently, as illustrated in FIG. 3A, a source electrode 8 and a drain electrode 9 are formed.

More specifically, electrode recesses 8a, 9a are first formed at formation scheduled positions (electrode formation scheduled positions) for the source electrode and the drain electrode at the surface of the AlGaN layer 7.

A resist is applied on the whole surface. The resist is processed by lithography to form openings in the resist which expose the surface of the AlGaN layer 7 corresponding to the electrode formation scheduled positions. Thus, a resist mask having these openings is formed.

Using this resist mask, the AlGaN layer 7 and the AlN layer 6 at the electrode formation scheduled positions are dry etched and removed until the surface of the electron supply layer 4 is exposed. Thus, the electrode recesses 8a, 9a are formed, which expose the electrode formation scheduled positions at the surface of the electron supply layer. As an etching gas, for example, Cl$_2$ gas is used. Note that the electrode recesses 8a, 9a may be formed by performing etching to the middle of the AlGaN layer 7 or may be formed by performing etching beyond the surface of the electron supply layer 4.

The resist mask is removed by ashing or the like.

A resist mask for forming the source electrode and the drain electrode is formed. Here, for example, an eaves structure two-layer resist is used, which is suitable for a vapor deposition method and a lift-off method. This resist is applied on the whole surface, and openings for exposing the electrode recesses 8a, 9a are formed. Thus, the resist mask having these openings is formed.

Using this resist mask, Ti/Al for example is deposited as an electrode material by the vapor deposition method for example, on the resist mask including the inside of the openings for exposing the electrode recesses 8a, 9a. The thickness of Ti is approximately 20 nm, and the thickness of Al is approximately 200 nm. By the lift-off method, the resist mask and Ti/Al deposited thereon are removed. Thereafter, the SiC substrate 1 is heat treated at a temperature of approximately 400° C. to 1000° C., for example approximately 550° C., in a nitrogen atmosphere for example, thereby bringing the remaining Ti/Al into ohmic contact with the electron supply layer 4. As long as the ohmic contact of Ti/Al with the electron supply layer 4 can be obtained, there may be cases where the heat treatment is unnecessary. Thus, the source electrode 8 and the drain electrode 9 are formed such that the electrode recesses 8a, 9a are embedded by part of the electrode material.

Figure 3B:
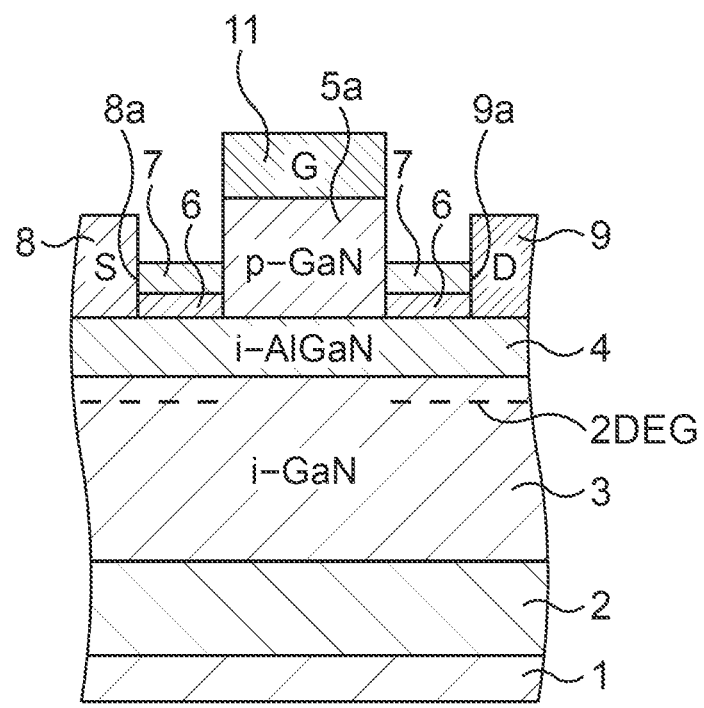

Subsequently, as illustrated in FIG. 3B, a gate electrode 11 is formed.

More specifically, first, a mask for forming the gate electrode is formed. Here, for example, SiN is deposited on the whole surface by a CVD method or the like, and dry etching using, for example, CF$_4$ gas is performed to form an opening in SiN, which exposes the upper surface of the p-type GaN layer 5a. Thus, the mask having this opening is formed.

Using this mask, Ni/Au for example is deposited as an electrode material by the vapor deposition method for example, on the mask including the inside of the opening for exposing the upper surface of the p-type GaN layer 5a. The thickness of Ni is approximately 30 nm, and the thickness of Au is approximately 400 nm. By the lift-off method, the mask and Ni/Au deposited thereon are removed. The mask is not removed but can be utilized as a protective film. Thus, the gate electrode 11 is formed on the p-type GaN layer 5a.

Thereafter, through processes such as forming an interlayer insulating film, forming wirings connected to the source electrode 8, the drain electrode 9, and the gate electrode 11, forming an upper protective film, forming a connection electrode exposed on the uppermost surface and so on, the AlGaN/GaN.HEMT according to this embodiment is formed.

The AlGaN/GaN.HEMT according to this embodiment has characteristics in a band gap of each of the compound semiconductor layers.

Figure 4:
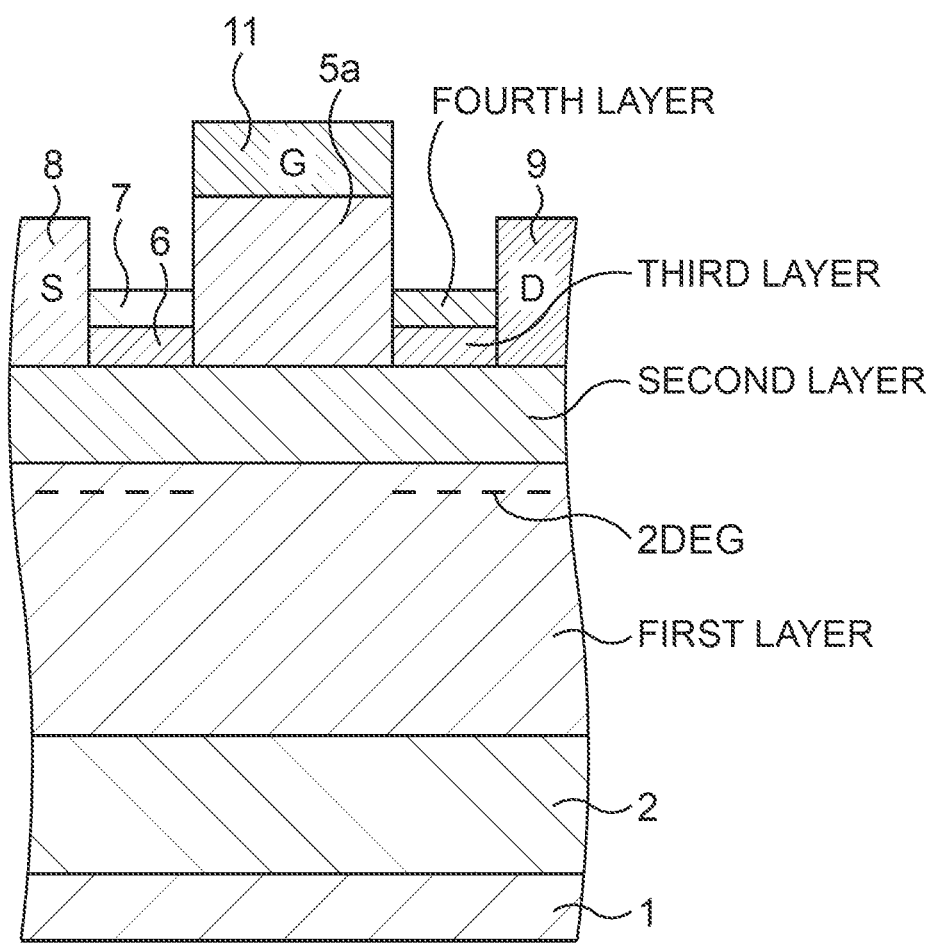
FIG. 4 is a schematic cross-sectional view illustrating compound semiconductor layers of the AlGaN/GaN.HEMT according to the first embodiment.
Figure 5:
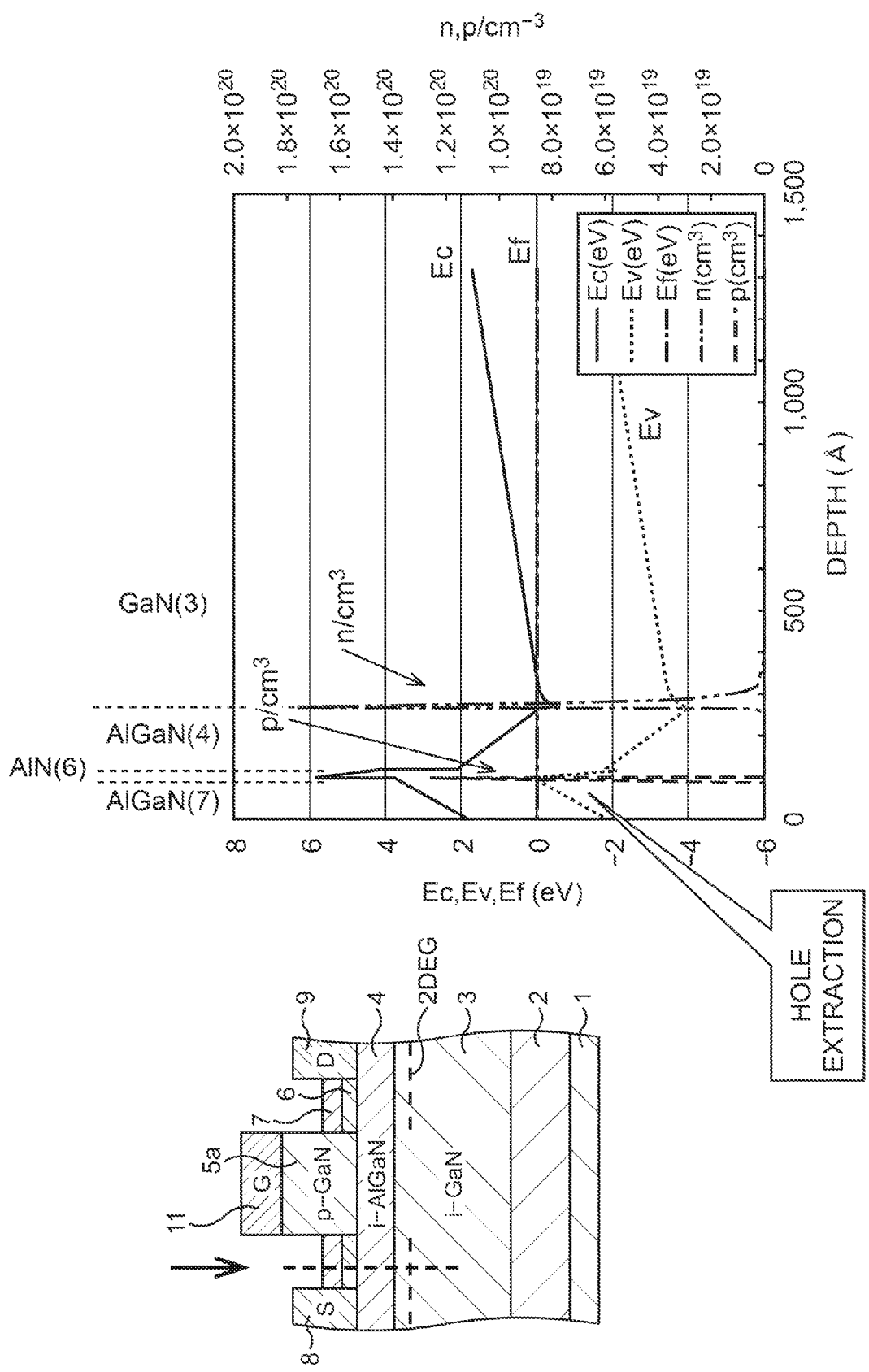
FIG. 5 is a characteristic chart representing a band gap of each of the compound semiconductor layers of the AlGaN/GaN.HEMT according to the first embodiment.

FIG. 4 corresponds to FIG. 3B and is a schematic cross-sectional view illustrating the compound semiconductor layers of the AlGaN/GaN.HEMT according to this embodiment. FIG. 5 is a characteristic chart representing the band gap of each of the compound semiconductor layers of the AlGaN/GaN.HEMT according to this embodiment and corresponds to a cross section along a broken line indicated by an arrow L illustrated on the left side.

The electron transit layer 3, the electron supply layer 4, the AlN layer 6 and the AlGaN layer 7 in FIG. 3B and so on are concrete examples of a first layer, a second layer, a third layer and a fourth layer in FIG. 4. BG1, BG2, BG3 and BG4 that are band gaps of the first layer, the second layer, the third layer and the fourth layer satisfy the following relations.

$$BG3 > BG2 > BG1 \tag{1}$$

and $$BG3 > BG4 > \tag{2}$$

Satisfying BG2>BG1 in Expression (1) is a requirement for generating two-dimensional electron gas (2DEG). In more detail, in the HEMT, the 2DEG is generated in the vicinity of an interface, of the electron transit layer 3, with the electron supply layer 4 (in an intermediate layer if it is provided). The 2DEG is generated based on a lattice constant difference between the compound semiconductor (here, GaN) of the electron transit layer 3 and the compound semiconductor (here, AlGaN) of the electron supply layer 4.

As represented in FIG. 5, it is found that 2DEG (n/cm³) of high concentration is generated in the vicinity of the interface, of the electron transit layer 3, with the electron supply layer 4 because the relation of BG2>BG1 is satisfied.

Figure 6:
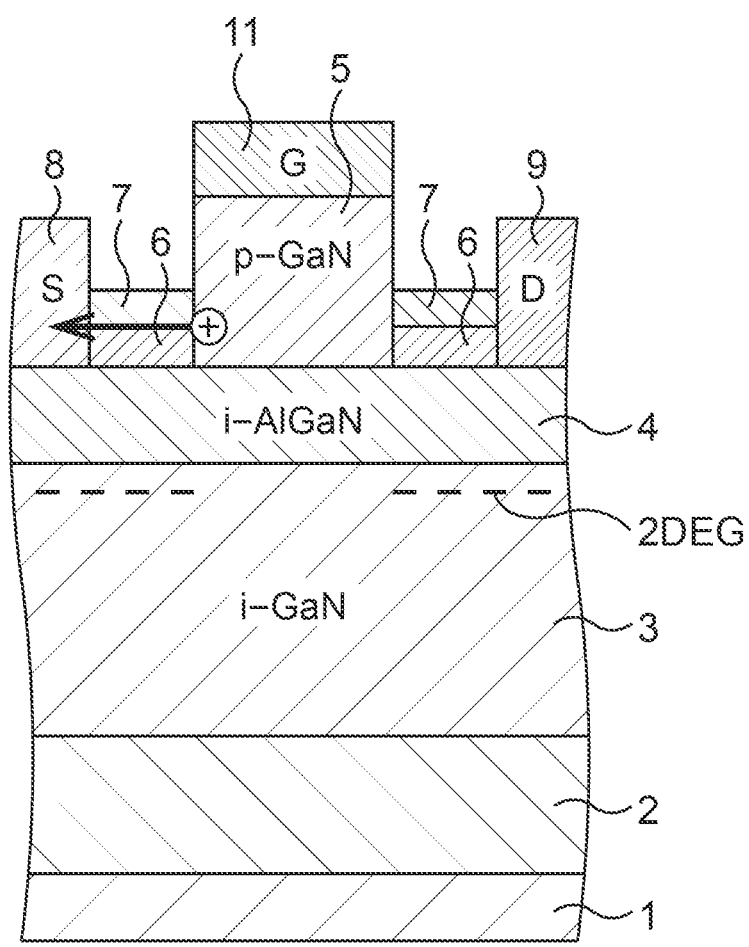
FIG. 6 is a schematic cross-sectional view for explaining a function of the AlGaN/GaN.HEMT according to the first embodiment.

Satisfying BG3>BG2 in Expression (1) and satisfying BG3>BG4 in Expression (2) is a requirement for generating halls in the vicinity of an interface, of the AlN layer 6, with the AlGaN layer 7. This means that the halls accumulated in a lower portion of the p-type GaN layer 5a pass through the vicinity of the interface between the AlN layer 6 and the AlGaN layer 7 to the source electrode 8 as illustrated in FIG. 6.

As represented in FIG. 5, it is found that halls of relatively high concentration exist in the vicinity of the interface between the AlN layer 6 and the AlGaN layer 7 because the relations of BG3>BG2 and BG3>BG4 are satisfied.

In the AlGaN/GaN.HEMT according to this embodiment, the first layer, the second layer, the third layer and the fourth layer satisfy Expression (1) and Expression (2). Thus, the first to fourth layers are not limited to the compound semiconductor layers exemplified in FIG. 2A to FIG. 2C and FIG. 3A and FIG. 3B.

As the third layer, for example, AlGaN having an Al composition ratio larger than the Al composition ratio (0.2 in the above example) of the electron supply layer 4, for example, $Al_{0.8}Ga_{0.2}N$ having an Al composition ratio of 0.8 may be used instead of the AlN layer 6. Further, as the fourth layer, it is also preferable to form i-GaN or n-GaN instead of the AlGaN layer 7.

Figure 1:
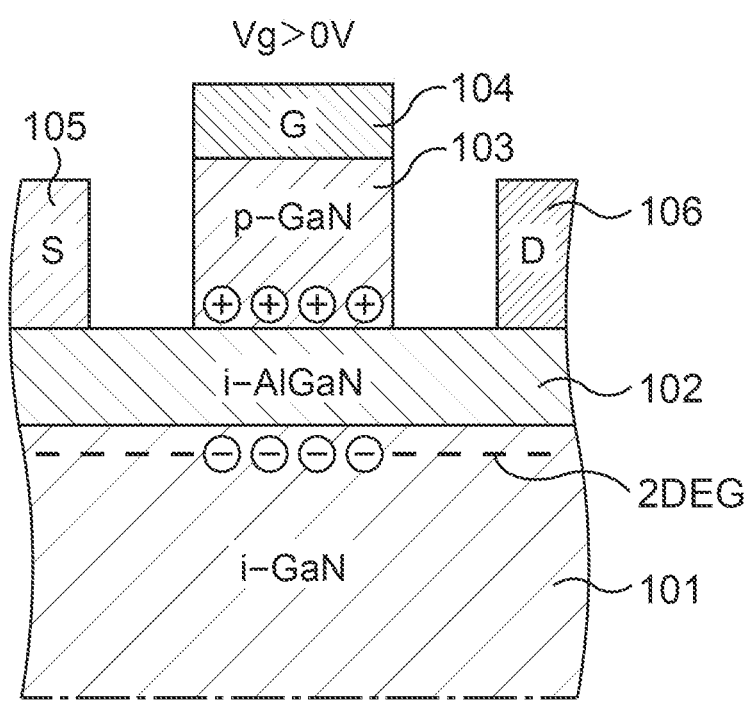
FIG. 1 is a schematic cross-sectional view illustrating a schematic structure of an AlGaN/GaN.HEMT according to a prior art.
Figure 7A:
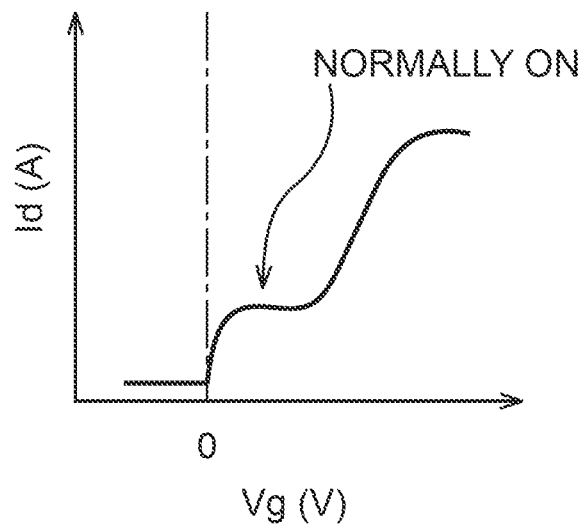
FIG. 7A and FIG. 7B are characteristic charts representing the relation between a gate voltage (Vd) and a drain current (Id) based on comparison of the AlGaN/GaN.HEMT according to the first embodiment with an AlGaN/GaN.HEMT of a comparative example.
Figure 7B:
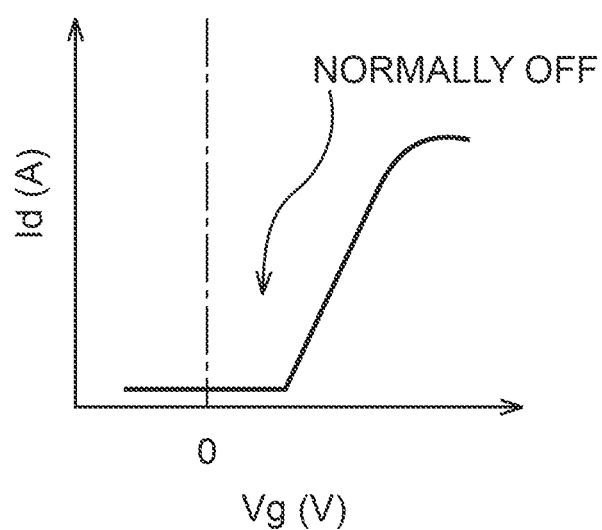

FIG. 7A and FIG. 7B are characteristic charts representing the relation between a gate voltage (Vd) and a drain current (Id) based on comparison of the AlGaN/GaN.HEMT according to this embodiment with an AlGaN/GaN.HEMT of a comparative example. FIG. 7A is a characteristic chart of the AlGaN/GaN.HEMT illustrated in FIG. 1 as the comparative example, and FIG. 7B is a characteristic chart of the AlGaN/GaN.HEMT according to this embodiment.

In the comparative example, it is found that the AlGaN/GaN.HEMT is Normally On in which it is turned on at a value equal to or less than a threshold voltage when no voltage is applied to the gate electrode because of uneven distribution of halls in the p-type GaN layer. In contrast, Normally Off is realized in this embodiment because there is no uneven distribution of halls in the p-type GaN layer. As described above, the uneven distribution of halls in the p-type GaN layer 5a is eliminated and a high enough threshold voltage is achieved to realize Normally Off in this embodiment.

As described above, in this embodiment, a highly reliable high-withstand-voltage AlGaN/GaN HEMT is obtained which achieves a high enough threshold voltage without withstand voltage deterioration nor operation instability by a relatively simple structure to surely achieve Normally Off.

Second Embodiment

This embodiment discloses a structure and a method of manufacturing an AlGaN/GaN HEMT as in the first embodiment but is different from the first embodiment in that the formation state of the AlN layer on the electron supply layer is different. Note that the same constituent members and so on as those in the first embodiment will be denoted by the same reference signs, and a detailed description thereof will be omitted.

FIG. 8A to FIG. 8C and FIG. 9A and FIG. 9B are schematic cross-sectional views illustrating a method of manufacturing the AlGaN/GaN HEMT according to a second embodiment in order of processes.

Figure 8A:
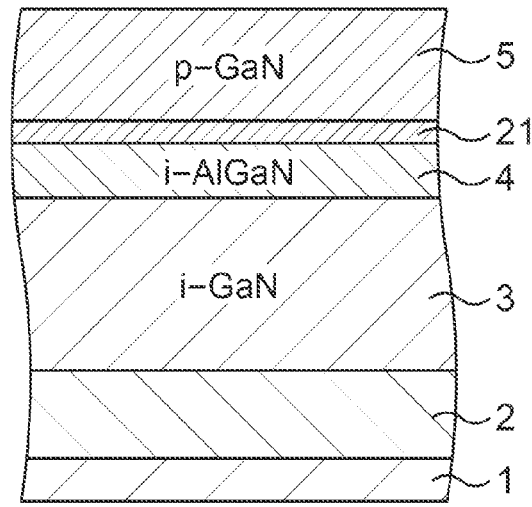
FIG. 8A to FIG. 8C are schematic cross-sectional views illustrating a method of manufacturing an AlGaN/GaN HEMT according to a second embodiment in order of processes.

First, as illustrated in FIG. 8A, a buffer layer 2, an electron transit layer 3, an electron supply layer 4, an AlN layer 21 and a p-type GaN layer 5 are formed in order on, for example, a SiC substrate 1 being a growth substrate.

More specifically, the following compound semiconductors are grown in a reduced-pressure atmosphere by the MOVPE method on the growth conditions described in the first embodiment. The MBE method or the like may be used instead of the MOVPE method.

On the SiC substrate 1, AlN is grown with a thickness of about 100 nm, i-GaN is grown with a thickness of about 3 μm, i-AlGaN is grown with a thickness of about 20 nm, AlN is grown with a thickness of about 2 nm, and p-GaN is grown with a thickness of about 80 nm in order. To grow AlN, mixed gas of TMAl gas and $NH_3$ gas is used as a source gas. To grow i-GaN, mixed gas of TMG gas and $NH_3$ gas is used as a source gas. To grow i-AlGaN, mixed gas of TMG gas, TMAl gas and $NH_3$ gas is used as a source gas. To grow p-GaN, mixed gas of TMG gas and $NH_3$ gas is used as a source gas and, for example, CpMg gas containing, for example, Mg as p-type impurity is fed to the source gas. Thus, the buffer layer 2, the electron transit layer 3, the electron supply layer 4, the AlN layer 21 and the p-type GaN layer 5 are formed.

Figure 8B:
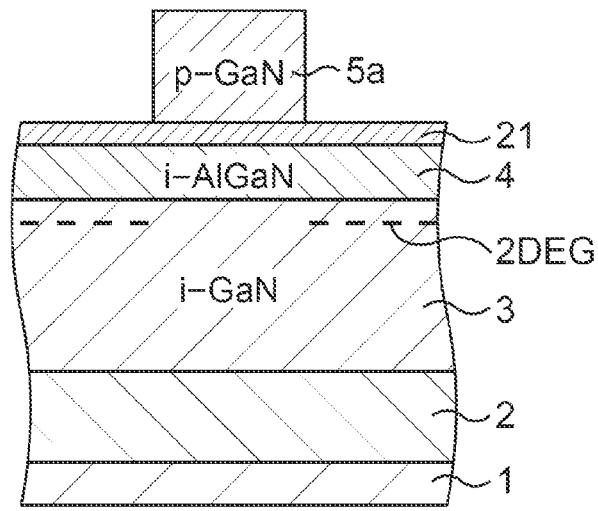

Subsequently, as illustrated in FIG. 8B, the p-type GaN layer 5 is etched.

More specifically, a resist is applied on the p-type GaN layer 5, and a site other than a gate electrode formation scheduled region is irradiated with ultraviolet ray using a predetermined mask. Thus, a resist mask covering the gate electrode formation scheduled region of the p-type GaN layer 5 with the resist is formed. By using this resist mask and using $Cl_2$-based etching gas, the p-type GaN layer 5 is dry etched. Thus, the p-type GaN layer 5 remains only in the gate electrode formation scheduled region. The remaining p-type GaN layer 5 is a p-type GaN layer 5a.

The resist mask is removed by ashing or chemical treatment.

Figure 8C:
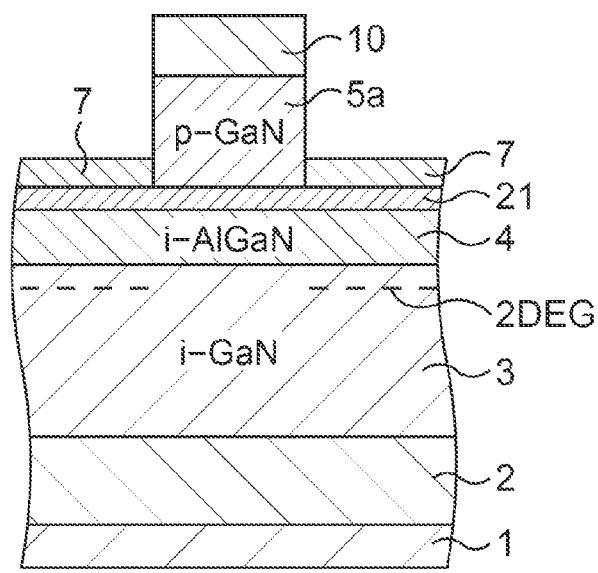

Subsequently, as illustrated in FIG. 8C, an AlGaN layer 7 is formed on the AlN layer 21 on both side surfaces of the p-type GaN layer 5a.

More specifically, a predetermined resist mask is first formed and, for example, $SiO_2$ is deposited by the CVD method or the like to form a mask layer 10 covering an upper surface of the p-type GaN layer 5a.

Then, i-AlGaN is grown with a thickness of about 10 nm on the AlN layer 21 in a reduced-pressure atmosphere by the MOVPE method. Thus, the AlGaN layer 7 is formed. The AlGaN layer 7 is composed of, for example, $i-Al_{0.1}Ga_{0.9}N$ having an Al composition ratio of 0.1 so as to have an Al composition ratio smaller than the Al composition ratio (0.2 in the above example) of the electron supply layer 4.

The mask layer 10 is removed by chemical treatment or the like.

Subsequently, element isolation structures are formed.

More specifically, argon (Ar), for instance, is injected to element isolation regions above the SiC substrate 1. Thus, the element isolation structures are formed in the AlGaN layer 7, the AlN layer 21, the electron supply layer 4 and in a surface layer portion of the electron transit layer 3. The element isolation structures demarcate active regions on the AlGaN layer 7.

Incidentally, instead of the above injection method, the STI method, for instance, may be performed for the element isolation.

Figure 9A:
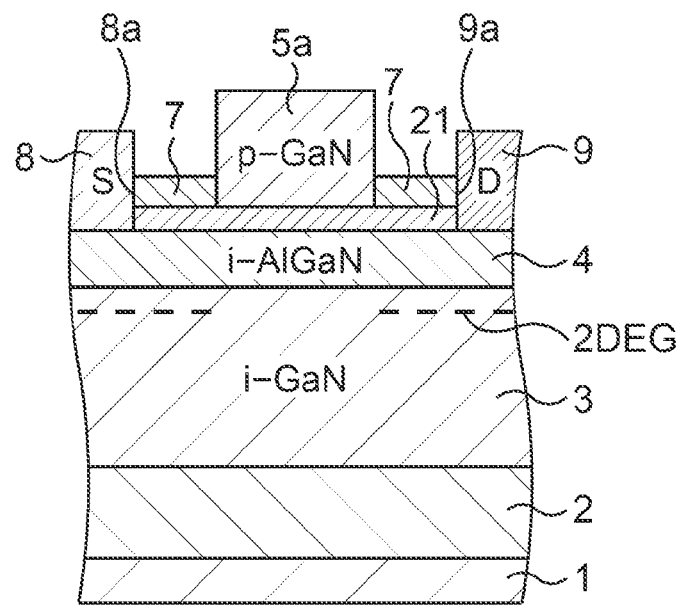
FIG. 9A and FIG. 9B are schematic cross-sectional views, subsequent to FIG. 8A to FIG. 8C, illustrating the method of manufacturing the AlGaN/GaN HEMT according to the second embodiment in order of processes.

Subsequently, as illustrated in FIG. 9A, a source electrode 8 and a drain electrode 9 are formed.

More specifically, electrode recesses 8a, 9a are first formed at formation scheduled positions (electrode formation scheduled positions) for the source electrode and the drain electrode at the surface of the AlGaN layer 7.

A resist is applied on an exposed surface including the surface of the AlGaN layer 7. The resist is processed by lithography to form openings in the resist which expose the surface of the AlGaN layer 7 corresponding to the electrode formation scheduled positions. Thus, a resist mask having these openings is formed.

Using this resist mask, the AlGaN layer 7 and the AlN layer 21 at the electrode formation scheduled positions are dry etched and removed until the surface of the electron supply layer 4 is exposed. Thus, the electrode recesses 8a, 9a are formed, which expose the electrode formation scheduled positions at the surface of the electron supply layer. As an etching gas, for example, $Cl_2$ gas is used. Note that the electrode recesses 8a, 9a may be formed by performing etching to the middle of the AlGaN layer 7 or may be formed by performing etching beyond the surface of the electron supply layer 4.

The resist mask is removed by ashing or the like.

A resist mask for forming the source electrode and the drain electrode is formed. Here, for example, an eaves structure two-layer resist is used, which is suitable for a vapor deposition method and a lift-off method. This resist is applied on the exposed surface including the surface of the AlGaN layer 7, and openings for exposing the electrode recesses 8a, 9a are formed. Thus, the resist mask having these openings is formed.

Using this resist mask, Ti/Al for example is deposited as an electrode material by the vapor deposition method for example, on the resist mask including the inside of the openings for exposing the electrode recesses 8a, 9a. The thickness of Ti is approximately 20 nm, and the thickness of Al is approximately 200 nm. By the lift-off method, the resist mask and Ti/Al deposited thereon are removed. Thereafter, the SiC substrate 1 is heat treated at a temperature of approximately 400° C. to 1000° C., for example approximately 550° C., in a nitrogen atmosphere for example, thereby bringing the remaining Ti/Al into ohmic contact with the electron supply layer 4. As long as the ohmic contact of Ti/Al with the electron supply layer 4 can be obtained, there may be cases where the heat treatment is unnecessary. Thus, the source electrode 8 and the drain electrode 9 are formed such that the electrode recesses 8a, 9a are embedded by part of the electrode material.

Figure 9B:
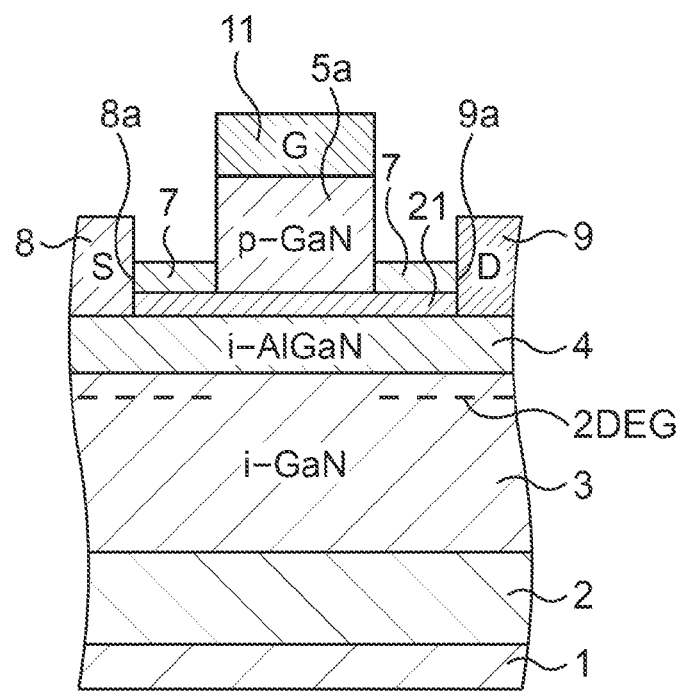

Subsequently, as illustrated in FIG. 9B, a gate electrode 11 is formed.

More specifically, first, a mask for forming the gate electrode is formed. Here, for example, SiN is deposited on the whole surface by the CVD method or the like, and dry etching using, for example, $CF_4$ gas is performed to form an opening in SiN, which exposes the upper surface of the p-type GaN layer 5a. Thus, the mask having this opening is formed.

Using this mask, Ni/Au for example is deposited as an electrode material by the vapor deposition method for example, on the mask including the inside of the opening for exposing the upper surface of the p-type GaN layer 5a. The thickness of Ni is approximately 30 nm, and the thickness of Au is approximately 400 nm. By the lift-off method, the mask and Ni/Au deposited thereon are removed. The mask is not removed but can be utilized as a protective film. Thus, the gate electrode 11 is formed on the p-type GaN layer 5a.

Thereafter, through processes such as forming an interlayer insulating film, forming wirings connected to the source electrode 8, the drain electrode 9, and the gate electrode 11, forming an upper protective film, forming a connection electrode exposed on the uppermost surface and so on, the AlGaN/GaN.HEMT according to this embodiment is formed.

As described above, in this embodiment, a highly reliable high-withstand-voltage AlGaN/GaN HEMT is obtained which achieves a high enough threshold voltage without withstand voltage deterioration nor operation instability by a relatively simple structure to surely achieve Normally Off.

Further, the AlN layer 21 is formed between the electron supply layer 4 and the p-type GaN layer 5a in this embodiment. In other words, the AlN layer 21 exists directly under the p-type GaN layer 5a, so that diffusion of Mg being the p-type impurity to the channel side (the electron supply layer 4 side) is suppressed by the AlN layer 21 at activation annealing in forming the p-type GaN layer 5 and at formation of the AlGaN layer 7 for regrowth of the compound semiconductor. This suppresses a rise in on-resistance (Ron) caused by the diffusion of Mg being the p-type impurity.

Third Embodiment

This embodiment discloses a structure and a method of manufacturing an AlGaN/GaN HEMT as in the first embodiment but is different from the first embodiment in that the formation state of the AlN layer on the electron supply layer is different. Note that the same constituent members and so on as those in the first embodiment will be denoted by the same reference signs, and a detailed description thereof will be omitted.

FIG. 10A and FIG. 10B and FIG. 11A and FIG. 11B are schematic cross-sectional views illustrating a method of manufacturing the AlGaN/GaN HEMT according to a third embodiment in order of processes.

Figure 10A:
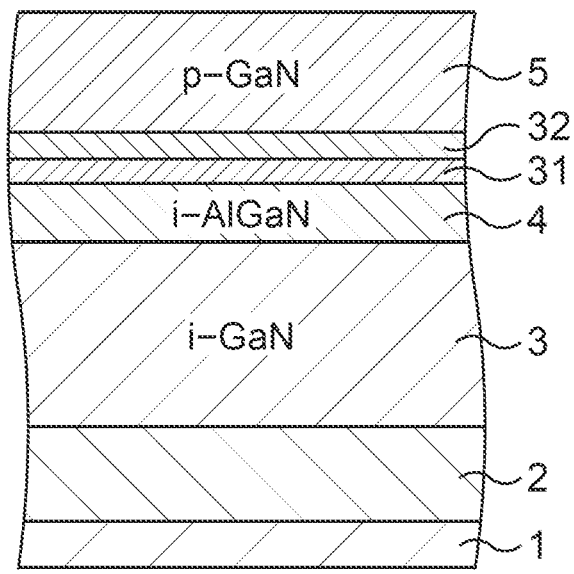
FIG. 10A and FIG. 10B are schematic cross-sectional views illustrating a method of manufacturing an AlGaN/GaN HEMT according to a third embodiment in order of processes.

First, as illustrated in FIG. 10A, a buffer layer 2, an electron transit layer 3, an electron supply layer 4, an AlN layer 31, a GaN layer 32 and a p-type GaN layer 5 are formed in order on, for example, a SiC substrate 1 being a growth substrate.

More specifically, the following compound semiconductors are grown in a reduced-pressure atmosphere by the MOVPE method on the growth conditions described in the first embodiment. The MBE method or the like may be used instead of the MOVPE method.

On the SiC substrate 1, AlN is grown with a thickness of about 100 nm, i-GaN is grown with a thickness of about 3 μm, i-AlGaN is grown with a thickness of about 20 nm, AlN is grown with a thickness of about 2 nm, i-GaN is grown with a thickness of about 10 μm, and p-GaN is grown with a thickness of about 80 nm in order. To grow AlN, mixed gas of TMAl gas and $NH_3$ gas is used as a source gas. To grow i-GaN, mixed gas of TMG gas and $NH_3$ gas is used as a source gas. To grow i-AlGaN, mixed gas of TMG gas, TMAl gas and $NH_3$ gas is used as a source gas. To grow p-GaN, mixed gas of TMG gas and $NH_3$ gas is used as a source gas and, for example, CpMg gas containing, for example, Mg as p-type impurity is fed to the source gas. Thus, the buffer layer 2, the electron transit layer 3, the electron supply layer 4, the AlN layer 31, the GaN layer 32 and the p-type GaN layer 5 are formed.

Figure 10B:
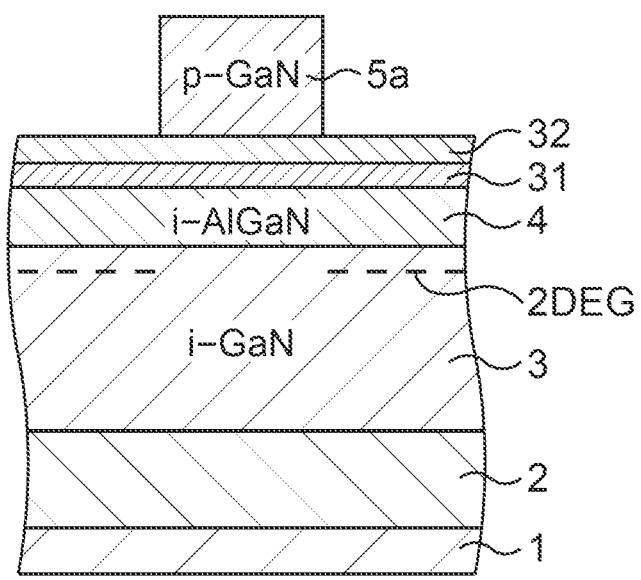

Subsequently, as illustrated in FIG. 10B, the p-type GaN layer 5 is etched.

More specifically, a resist is applied on the p-type GaN layer 5, and a site other than a gate electrode formation scheduled region is irradiated with ultraviolet ray using a predetermined mask. Thus, a resist mask covering the gate electrode formation scheduled region of the p-type GaN layer 5 with the resist is formed. By using this resist mask and using $Cl_2$-based etching gas, the p-type GaN layer is dry etched. Thus, the p-type GaN layer 5 remains only in the gate electrode formation scheduled region. The remaining p-type GaN layer 5 is a p-type GaN layer 5a.

The resist mask is removed by ashing or chemical treatment.

Subsequently, element isolation structures are formed.

More specifically, argon (Ar), for instance, is injected to element isolation regions above the SiC substrate 1. Thus, the element isolation structures are formed in the GaN layer 32, the AlN layer 31, the electron supply layer 4 and in a surface layer portion of the electron transit layer 3. The element isolation structures demarcate active regions on the AlGaN layer 7.

Incidentally, instead of the above injection method, the STI method, for instance, may be performed for the element isolation.

Figure 11A:
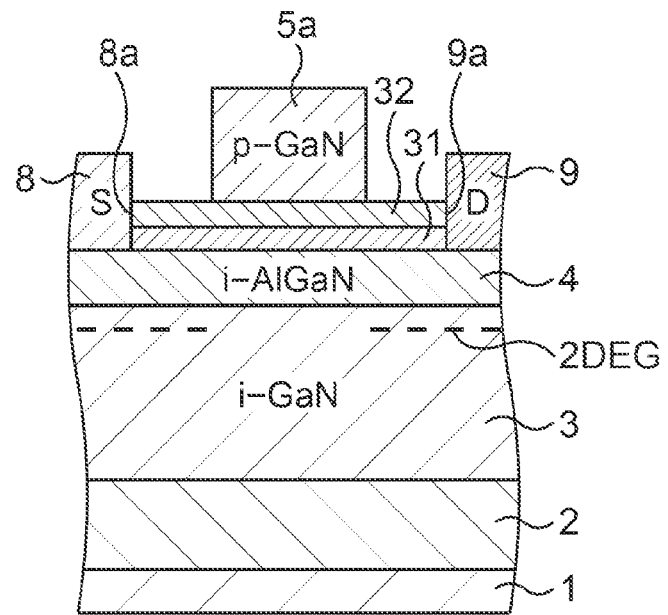
FIG. 11A and FIG. 11B are schematic cross-sectional views, subsequent to FIG. 10A and FIG. 10B, illustrating the method of manufacturing the AlGaN/GaN HEMT according to the third embodiment in order of processes.

Subsequently, as illustrated in FIG. 11A, a source electrode 8 and a drain electrode 9 are formed.

More specifically, electrode recesses 8a, 9a are first formed at formation scheduled positions (electrode formation scheduled positions) for the source electrode and the drain electrode at the surface of the GaN layer 32.

A resist is applied on an exposed surface including the surface of the GaN layer 32. The resist is processed by lithography to form openings in the resist which expose the surface of the GaN layer 32 corresponding to the electrode formation scheduled positions. Thus, a resist mask having these openings is formed.

Using this resist mask, the GaN layer 32 and the AlN layer 31 at the electrode formation scheduled positions are dry etched and removed until the surface of the electron supply layer 4 is exposed. Thus, the electrode recesses 8a, 9a are formed, which expose the electrode formation scheduled positions at the surface of the electron supply layer. As an etching gas, for example, $Cl_2$ gas is used. Note that the electrode recesses 8a, 9a may be formed by performing etching to the middle of the GaN layer 32 or may be formed by performing etching beyond the surface of the electron supply layer 4.

The resist mask is removed by ashing or the like.

A resist mask for forming the source electrode and the drain electrode is formed. Here, for example, an eaves structure two-layer resist is used, which is suitable for a vapor deposition method and a lift-off method. This resist is applied on the whole surface, and openings for exposing the electrode recesses 8a, 9a are formed. Thus, the resist mask having these openings is formed.

Using this resist mask, Ti/Al for example is deposited as an electrode material by the vapor deposition method for example, on the resist mask including the inside of the openings for exposing the electrode recesses 8a, 9a. The thickness of Ti is approximately 20 nm, and the thickness of Al is approximately 200 nm. By the lift-off method, the resist mask and Ti/Al deposited thereon are removed. Thereafter, the SiC substrate 1 is heat treated at a temperature of approximately 400° C. to 1000° C., for example approximately 550° C., in a nitrogen atmosphere for example, thereby bringing the remaining Ti/Al into ohmic contact with the electron supply layer 4. As long as the ohmic contact of Ti/Al with the electron supply layer 4 can be obtained, there may be cases where the heat treatment is unnecessary. Thus, the source electrode 8 and the drain electrode 9 are formed such that the electrode recesses 8a, 9a are embedded by part of the electrode material.

Figure 11B:
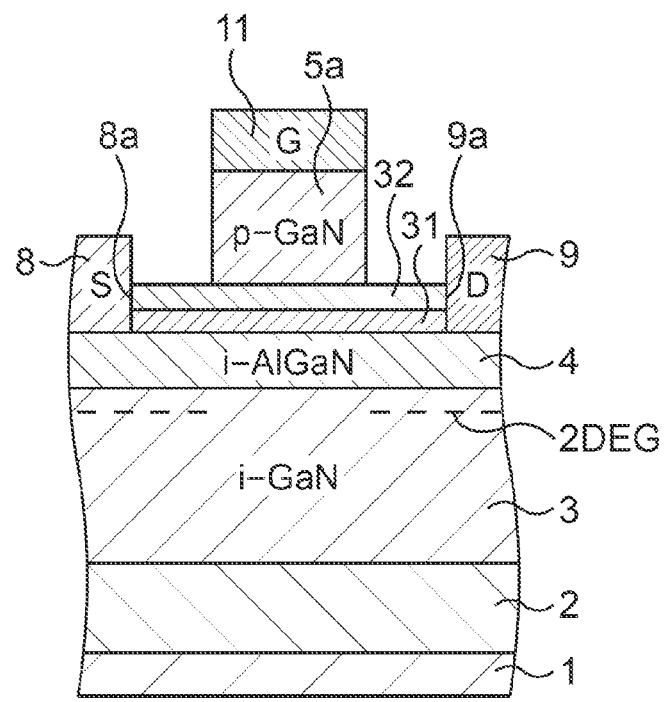

Subsequently, as illustrated in FIG. 11B, a gate electrode 11 is formed.

More specifically, first, a mask for forming the gate electrode is formed. Here, for example, SiN is deposited on the whole surface by the CVD method or the like, and dry etching using, for example, $CF_4$ gas is performed to form an opening in SiN, which exposes the upper surface of the p-type GaN layer 5a. Thus, the mask having this opening is formed.

Using this mask, Ni/Au for example is deposited as an electrode material by the vapor deposition method for example, on the mask including the inside of the opening for exposing the upper surface of the p-type GaN layer 5a. The thickness of Ni is approximately 30 nm, and the thickness of Au is approximately 400 nm. By the lift-off method, the mask and Ni/Au deposited thereon are removed. The mask is not removed but can be utilized as a protective film. Thus, the gate electrode 11 is formed on the p-type GaN layer 5a.

Thereafter, through processes such as forming an interlayer insulating film, forming wirings connected to the source electrode 8, the drain electrode 9, and the gate electrode 11, forming an upper protective film, forming a connection electrode exposed on the uppermost surface and so on, the AlGaN/GaN.HEMT according to this embodiment is formed.

As described above, in this embodiment, a highly reliable high-withstand-voltage AlGaN/GaN HEMT is obtained which achieves a high enough threshold voltage without withstand voltage deterioration nor operation instability by a relatively simple structure to surely achieve Normally Off.

Further, the GaN layer 32 and the AlN layer 31 are formed between the electron supply layer 4 and the p-type GaN layer 5a in this embodiment. In other words, the GaN layer 32 and the AlN layer 31 exist directly under the p-type GaN layer 5a, so that diffusion of Mg being the p-type impurity to the channel side (the electron supply layer 4 side) is suppressed by the GaN layer 32 and the AlN layer 31 at activation annealing in forming the p-type GaN layer 5 and the like. This suppresses a rise in on-resistance (Ron) caused by the diffusion of Mg being the p-type impurity.

Furthermore, a process for regrowth of the compound semiconductor is unnecessary in this embodiment, thereby realizing simplified manufacturing process.

Fourth Embodiment

This embodiment discloses a structure and a method of manufacturing an AlGaN/GaN HEMT as in the first embodiment but is different from the first embodiment in that the formation states of the AlN layer and the AlGaN layer on the electron supply layer are different. Note that the same constituent members and so on as those in the first embodiment will be denoted by the same reference signs, and a detailed description thereof will be omitted.

FIG. 12A to FIG. 12C and FIG. 13A to FIG. 13C are schematic cross-sectional views illustrating a method of manufacturing the AlGaN/GaN HEMT according to a fourth embodiment in order of processes.

Figure 12A:
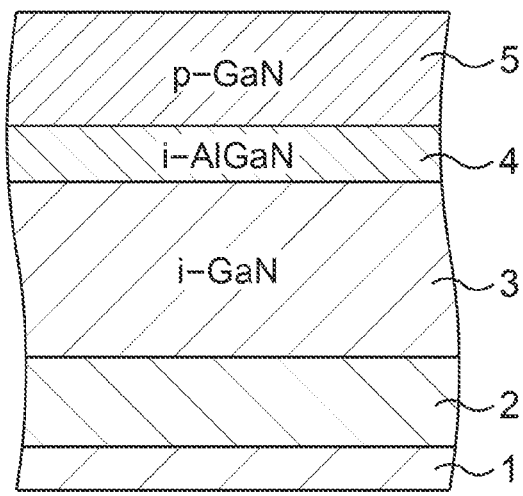
FIG. 12A to FIG. 12C are schematic cross-sectional views illustrating a method of manufacturing an AlGaN/GaN HEMT according to a fourth embodiment in order of processes.

First, a buffer layer 2, an electron transit layer 3, an electron supply layer 4, and a p-type GaN layer 5 are formed in order on, for example, a SiC substrate 1 being a growth substrate, as in FIG. 2A of the first embodiment. The appearance in this event is illustrated in FIG. 12A.

Figure 12B:
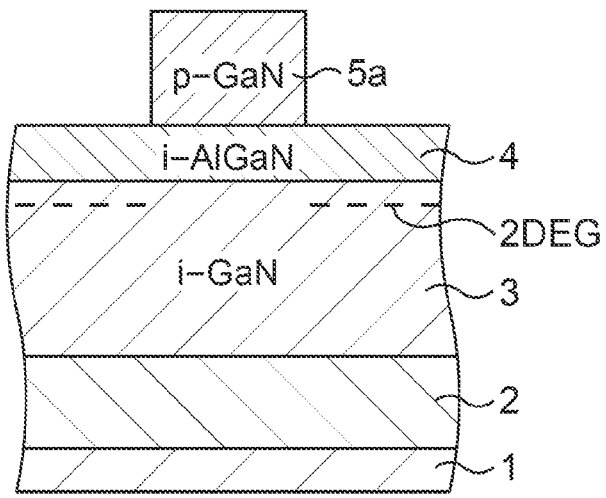

Subsequently, the p-type GaN layer 5 is dry etched as in FIG. 2B of the first embodiment to form a p-type GaN layer 5*a*. The appearance in this event is illustrated in FIG. 12B.

Figure 12C:
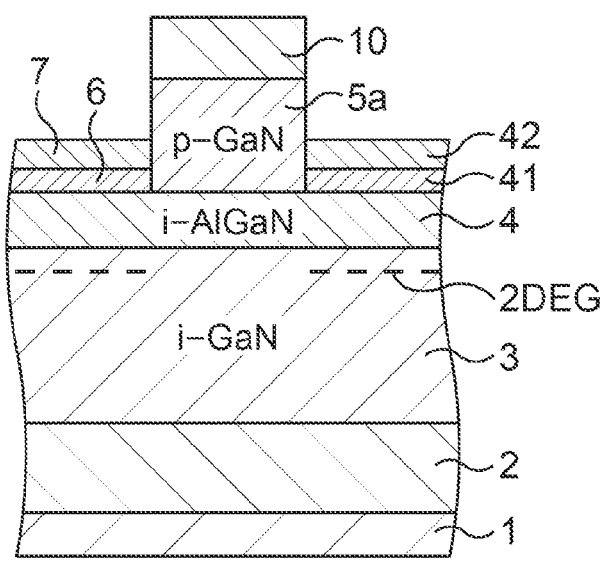

Subsequently, as illustrated in FIG. 12C, an AlN layer 41 and an AlGaN layer 42 are formed in order on the electron supply layer 4 on both side surfaces of the p-type GaN layer 5*a*.

More specifically, a predetermined resist mask is first formed and, for example, $SiO_2$ is deposited by the CVD method or the like to form a mask layer 10 covering an upper surface of the p-type GaN layer 5*a*.

Then, AlN is grown with a thickness of about 2 nm and i-AlGaN is grown with a thickness of about 10 nm, in order on the electron supply layer 4 in a reduced-pressure atmosphere by, for example, the MOVPE method. Thus, the AlN layer 41 and the AlGaN layer 42 are formed. The AlGaN layer 42 is composed of, for example, i-$Al_{0.1}Ga_{0.9}N$ having an Al composition ratio of 0.1.

The mask layer 10 is removed by chemical treatment or the like.

Figure 13A:
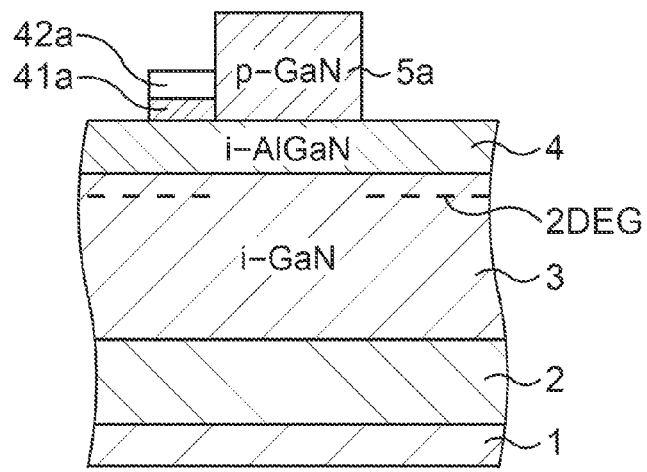
FIG. 13A to FIG. 13c are schematic cross-sectional views, subsequent to FIG. 12A to FIG. 12C, illustrating the method of manufacturing the AlGaN/GaN HEMT according to the fourth embodiment in order of processes.

Subsequently, as illustrated in FIG. 13A, the AlN layer 41 and the AlGaN layer 42 are etched.

More specifically, a resist is applied on the whole surface and processed by lithography to form a resist mask covering a predetermined site of the AlGaN layer 42 with the resist is formed. By using this resist mask and using chlorine gas (for example, $CF_4$ gas), the AlGaN layer 42 and the AlN layer 41 are dry etched. Thus, the AlN layer 41 and the AlGaN layer 42 remain only on a source electrode formation scheduled position side of the p-type GaN layer 5*a* in a manner to be in contact with a side surface on one side of the p-type GaN layer 5*a*. The remaining AlN layer 41 and AlGaN layer 42 are AlN layer 41*a* and AlGaN layer 42*a*.

The resist mask is removed by ashing or chemical treatment.

Subsequently, an element isolation structure is formed.

More specifically, argon (Ar), for instance, is injected to the element isolation region above the SiC substrate 1. Thus, the element isolation structure is formed in the AlGaN layer 42, the AlN layer 41, the electron supply layer 4 and in a surface layer portion of the electron transit layer 3. The element isolation structure demarcates an active region on the AlGaN layer 42.

Incidentally, instead of the above injection method, the STI method, for instance, may be performed for the element isolation.

Figure 13B:
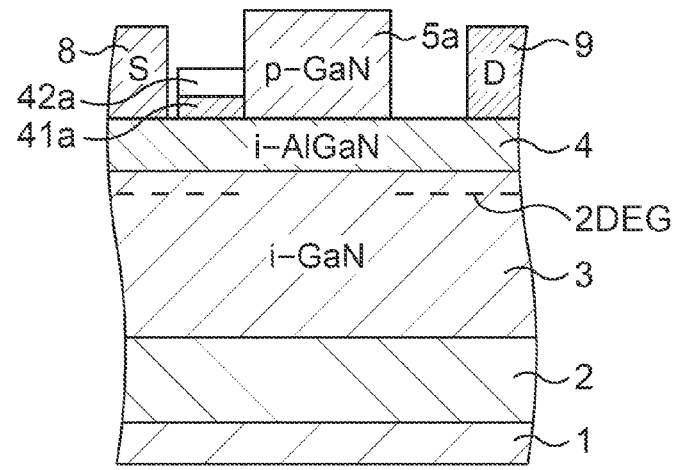

Subsequently, as illustrated in FIG. 13B, a source electrode 8 and a drain electrode 9 are formed.

More specifically, first, a resist mask for forming the source electrode and the drain electrode is formed. Here, for example, an eaves structure two-layer resist is used, which is suitable for a vapor deposition method and a lift-off method. This resist is applied on the whole surface, and openings for exposing formation scheduled positions (electrode formation scheduled positions) for the source electrode and the drain electrode at the surface of the electron supply layer 4 are formed. Thus, the resist mask having these openings is formed.

Using this resist mask, Ti/Al for example is deposited as an electrode material by the vapor deposition method for example, on the resist mask including the inside of the openings for exposing the electrode formation scheduled positions. The thickness of Ti is approximately 20 nm, and the thickness of Al is approximately 200 nm. By the lift-off method, the resist mask and Ti/Al deposited thereon are removed. Thereafter, the SiC substrate 1 is heat treated at a temperature of approximately 400° C. to 1000° C., for example approximately 550° C., in a nitrogen atmosphere for example, thereby bringing the remaining Ti/Al into ohmic contact with the electron supply layer 4. As long as the ohmic contact of Ti/Al with the electron supply layer 4 can be obtained, there may be cases where the heat treatment is unnecessary. Thus, the source electrode 8 and the drain electrode 9 are formed. Here, the source electrode 8 is formed to be separated from the AlN layer 41 and the AlGaN layer 42.

Figure 13C:
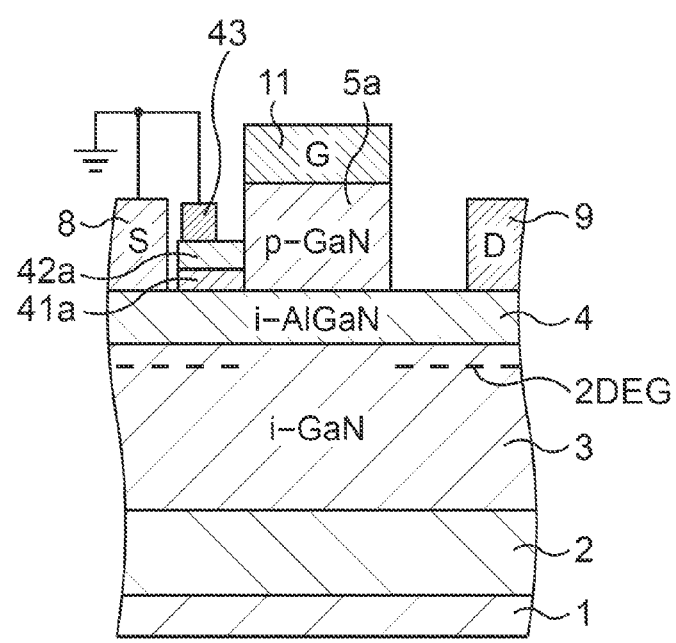

Subsequently, as illustrated in FIG. 13C, a gate electrode 11 and a connection electrode 43 are formed.

More specifically, first, a mask for forming the gate electrode and the connection electrode is formed. Here, for example, SiN is deposited on the whole surface by the CVD method or the like, and dry etching using, for example, $CF_4$ gas is performed to form openings in SiN, which expose the upper surface of the p-type GaN layer 5*a* and a part of an upper surface of the AlGaN layer 42. Thus, the mask having these openings is formed.

Using this mask, Ni/Au for example is deposited as an electrode material by the vapor deposition method for example, on the mask including the inside of the opening for exposing the upper surface of the p-type GaN layer 5*a* and the inside of the opening for exposing the part of the upper surface of the AlGaN layer 42. The thickness of Ni is approximately 30 nm, and the thickness of Au is approximately 400 nm. By the lift-off method, the mask and Ni/Au deposited thereon are removed. The mask is not removed but can be utilized as a protective film. Thus, the gate electrode 11 is formed on the p-type GaN layer 5*a*, and the connection electrode 43 electrically connected to the AlGaN layer 42 is formed on the upper surface of the AlGaN layer 42.

Thereafter, through processes such as forming an interlayer insulating film, forming wirings connected to the source electrode 8, the drain electrode 9, the gate electrode 11, and the connection electrode 43, forming an upper protective film, forming a connection electrode exposed on the uppermost surface and so on, the AlGaN/GaN.HEMT according to this embodiment is formed. In this embodiment, the connection electrode 43 is connected to the source electrode 8 both of which are grounded as illustrated in FIG. 13C.

Fifth Embodiment

This embodiment discloses a power supply device including one kind selected from among the AlGaN/GaN HEMTs according to the first to fourth embodiments.

Figure 14:
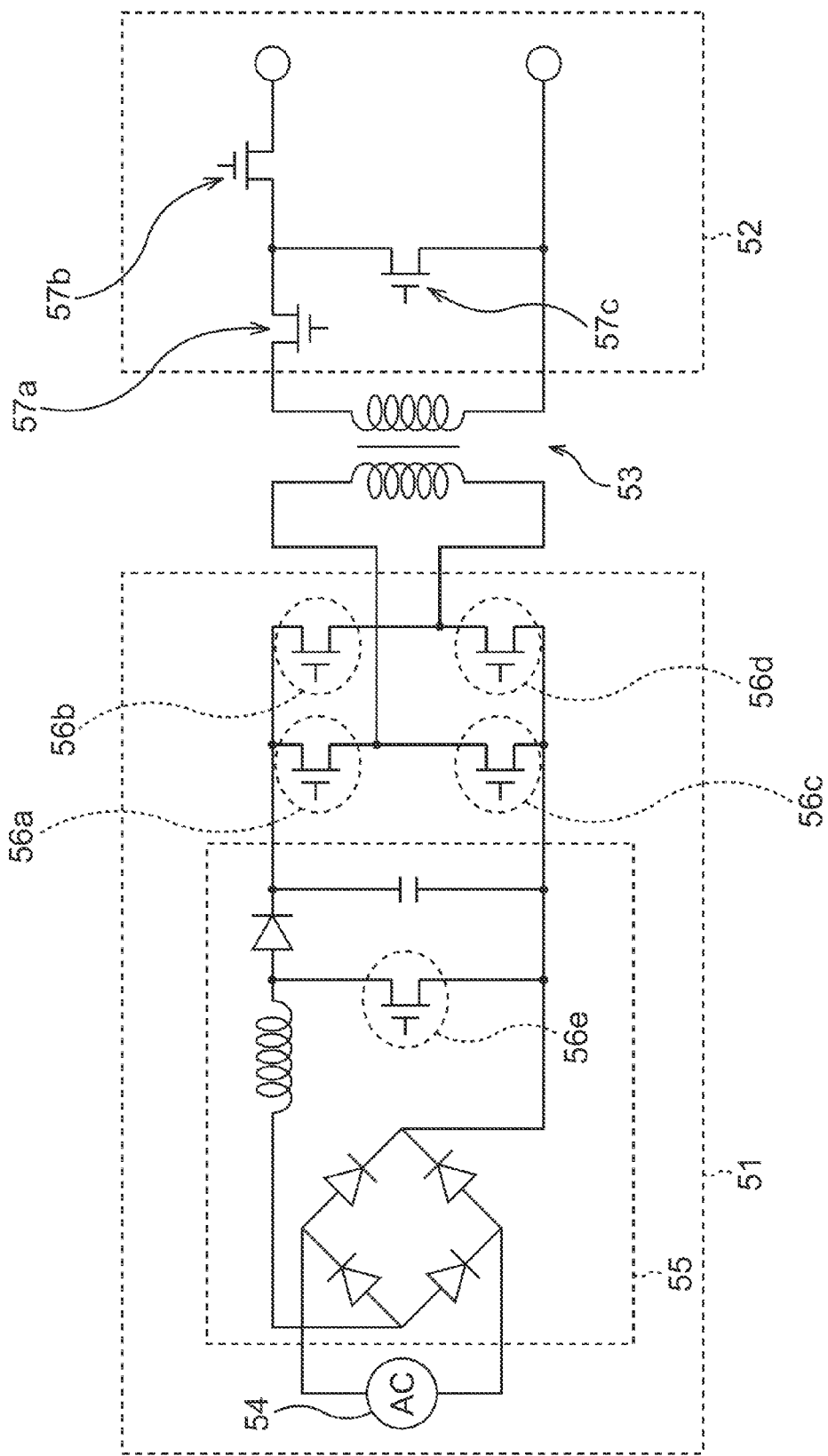
FIG. 14 is a connection diagram illustrating a schematic configuration of a power supply device according to a fifth embodiment.

FIG. 14 is a connection diagram illustrating a schematic configuration of a power supply device according to a fifth embodiment.

The power supply device according to this embodiment includes a high-voltage primary-side circuit 51, a low-voltage secondary-side circuit 52, and a transformer 53 disposed between the primary-side circuit 51 and the secondary-side circuit 52.

The primary-side circuit 51 includes an AC power supply 54, a so-called bridge rectifying circuit 55, and a plurality of (four here) switching elements 56*a*, 56*b*, 56*c*, 56*d*. Further, the bridge rectifying circuit 55 has a switching element 56*e*.

The secondary-side circuit 52 includes a plurality of (three here) switching elements 57*a*, 57*b*, 57*c*.

In this embodiment, the switching elements 56*a*, 56*b*, 56*c*, 56*d*, 56*e* of the primary-side circuit 51 are each one kind selected from among the AlGaN/GaN HEMTs according to the first to fourth embodiments. On the other hand, the switching elements 57*a*, 57*b*, 57*c* of the secondary-side circuit 52 are each an ordinary MIS.FET using silicon.

In this embodiment, a highly reliable high-withstand-voltage AlGaN/GaN HEMT which achieves a high enough threshold voltage without withstand voltage deterioration nor operation instability by a relatively simple structure to surely achieve Normally Off is applied to a high-voltage circuit. This realizes a highly reliable large-power power supply circuit.

Sixth Embodiment

This embodiment discloses a high-frequency amplifier including one kind selected from among the AlGaN/GaN HEMTs according to the first to fourth embodiments.

Figure 15:
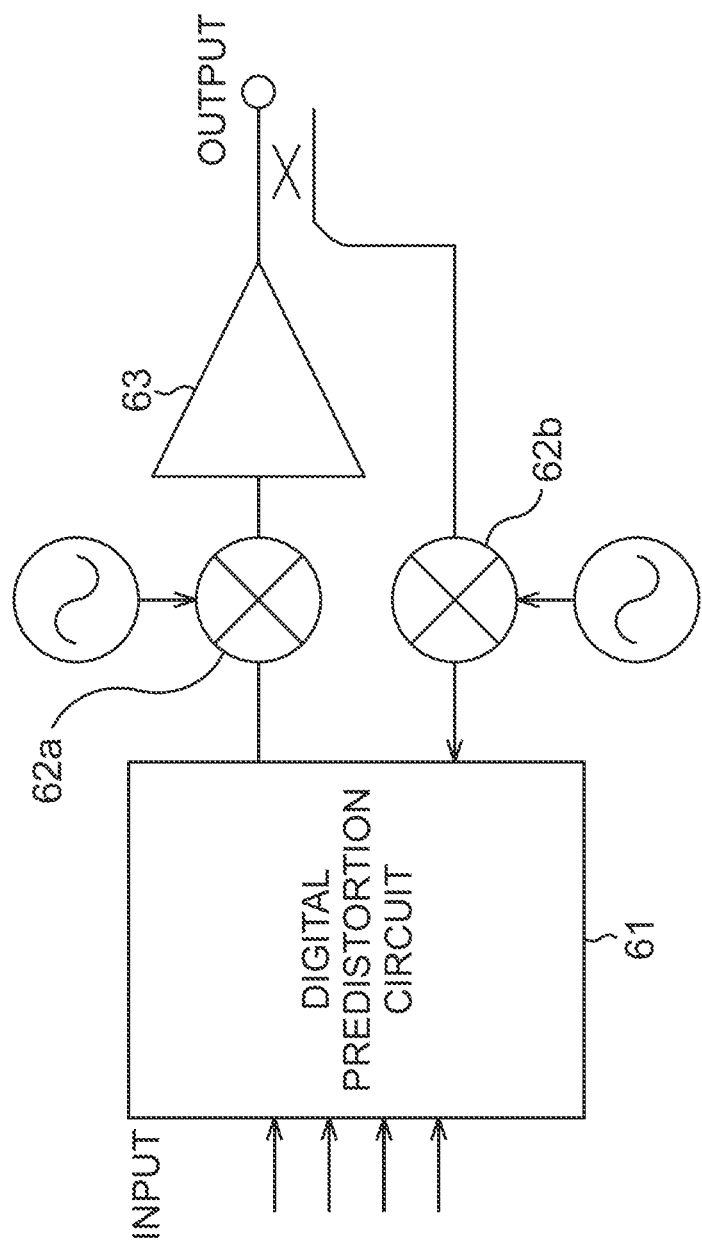
FIG. 15 is a connection diagram illustrating a schematic configuration of a high-frequency amplifier according to a sixth embodiment.

FIG. 15 is a connection diagram illustrating a schematic configuration of a high-frequency amplifier according to a sixth embodiment.

The high-frequency amplifier according to this embodiment includes a digital pre-distortion circuit 61, mixers 62a, 62b, and a power amplifier 63.

The digital pre-distortion circuit 61 compensates nonlinear distortion of an input signal. The mixer 62a mixes the input signal whose nonlinear distortion is compensated and an AC signal. The power amplifier 63 amplifies the input signal mixed with the AC signal, and has one kind selected from among the AlGaN/GaN HEMTs according to the first to fourth embodiments. In FIG. 15, by, for example, changing the switches, an output-side signal can be mixed with the AC signal by the mixer 62b, and the resultant can be sent out to the digital pre-distortion circuit 61.

In this embodiment, a highly reliable high-withstand-voltage AlGaN/GaN HEMT which achieves a high enough threshold voltage without withstand voltage deterioration nor operation instability by a relatively simple structure to surely achieve Normally Off is applied to a high-frequency amplifier. This realizes a highly reliable high-withstand-voltage high-frequency amplifier.

Other Embodiments

In the first to sixth embodiments, the AlGaN/GaN HEMTs are exemplified as the compound semiconductor devices. Other than the AlGaN/GaN HEMTs, the following HEMTs are applicable as the compound semiconductor devices.

Other HEMT Example 1

This example discloses an InAlN/GaN HEMT as a compound semiconductor device.

InAlN and GaN are compound semiconductors whose lattice constants can be made close to each other by their compositions. In this case, in the above-described first to sixth embodiments, the electron transit layer that is the first layer of the compound semiconductor is formed of i-GaN, and the electron supply layer that is the second layer is formed of i-InAlN. Further, the third layer and the fourth layer are formed as appropriate to satisfy both of Expression (1) and Expression (2).

In this case, piezoelectric polarization barely occurs, and thus the two-dimensional electron gas mainly occurs by spontaneous polarization of InAlN.

According to this example, a highly reliable high-withstand-voltage InAlN/GaN HEMT is realized which achieves a high enough threshold voltage without withstand voltage deterioration nor operation instability by a relatively simple structure to surely achieve Normally Off as in the above-described AlGaN/GaN.HEMTs.

Other HEMT Example 2

This example discloses an InAlGaN/GaN HEMT as a compound semiconductor device.

GaN and InAlGaN are compound semiconductors that the lattice constant of the latter can be made smaller than the lattice constant of the former by their compositions. In this case, in the above-described first to sixth embodiments, the electron transit layer that is the first layer of the compound semiconductor is formed of i-GaN, and the electron supply layer that is the second layer is formed of n-InAlGaN. Further, the third layer and the fourth layer are formed as appropriate to satisfy both of Expression (1) and Expression (2).

According to this example, a highly reliable high-withstand-voltage InAlGaN/GaN HEMT is realized which achieves a high enough threshold voltage without withstand voltage deterioration nor operation instability by a relatively simple structure to surely achieve Normally Off as in the above-described AlGaN/GaN.HEMTs.

According to the above aspects, a highly reliable high-withstand-voltage compound semiconductor device is realized which achieves a high enough threshold voltage without withstand voltage deterioration nor operation instability by a relatively simple structure to surely achieve Normally Off.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
a first compound semiconductor layer;
a second compound semiconductor layer larger in band gap than the first compound semiconductor layer, formed above the first compound semiconductor layer;
a third compound semiconductor layer having a p-type conductivity type, formed above the second compound semiconductor layer;
an electrode formed above the second compound semiconductor layer via the third compound semiconductor layer;
a fourth compound semiconductor layer larger in band gap than the second compound semiconductor layer, formed to be in contact with the third compound semiconductor layer above the second compound semiconductor layer; and
a fifth compound semiconductor layer smaller in band gap than the fourth compound semiconductor layer, formed to be in contact with the third compound semiconductor layer above the fourth compound semiconductor layer.

2. The compound semiconductor device according to claim 1,
wherein the fourth compound semiconductor layer and the fifth compound semiconductor layer are formed on side surfaces of the third compound semiconductor layer.

3. The compound semiconductor device according to claim 1,
wherein the fourth compound semiconductor layer is formed between the second compound semiconductor layer and the third compound semiconductor layer, and
wherein the fifth compound semiconductor layer is formed on side surfaces of the third compound semiconductor layer.

4. The compound semiconductor device according to claim 1,
wherein the fourth compound semiconductor layer and the fifth compound semiconductor layer are formed between the second compound semiconductor layer and the third compound semiconductor layer.

5. The compound semiconductor device according to claim 1,
wherein the fourth compound semiconductor layer and the fifth compound semiconductor layer are formed on a side surface only on one side of the third compound semiconductor layer.

6. The compound semiconductor device according to claim 5, further comprising:
a connection electrode electrically connected to the fifth compound semiconductor layer.

7. A power supply circuit comprising a transformer and a high-voltage circuit and a low-voltage circuit across the transformer,
the high-voltage circuit comprising a transistor,
the transistor comprising:
a first compound semiconductor layer;
a second compound semiconductor layer larger in band gap than the first compound semiconductor layer, formed above the first compound semiconductor layer;
a third compound semiconductor layer having a p-type conductivity type, formed above the second compound semiconductor layer;
an electrode formed above the second compound semiconductor layer via the third compound semiconductor layer;
a fourth compound semiconductor layer larger in band gap than the second compound semiconductor layer, formed to be in contact with the third compound semiconductor layer above the second compound semiconductor layer; and
a fifth compound semiconductor layer smaller in band gap than the fourth compound semiconductor layer, formed to be in contact with the third compound semiconductor layer above the fourth compound semiconductor layer.

* * * * *